US009413369B2

(12) United States Patent
Kim et al.

(10) Patent No.: US 9,413,369 B2
(45) Date of Patent: Aug. 9, 2016

(54) DIGITAL PHASE-LOCKED LOOP (DPLL), METHOD OF CONTROLLING DPLL, AND ULTRA LOW POWER (ULP) TRANSCEIVER USING DPLL

(71) Applicants: Samsung Electronics Co., Ltd., Suwon-si (KR); Research & Business Foundation Sungkyunkwan University, Suwon-si (KR)

(72) Inventors: Seong Joong Kim, Hwaseong-si (KR); Seok Ju Yun, Hwaseong-si (KR); Young Jun Hong, Seoul (KR); Hyung Gu Park, Suwon-si (KR); Kang Yoon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/600,533

(22) Filed: Jan. 20, 2015

(65) Prior Publication Data

US 2015/0207514 A1     Jul. 23, 2015

(30) Foreign Application Priority Data

Jan. 20, 2014 (KR) .................... 10-2014-0006934

(51) Int. Cl.
*H03D 3/24* (2006.01)
*H03L 7/099* (2006.01)
*H04B 1/40* (2015.01)

(52) U.S. Cl.
CPC ............... *H03L 7/0992* (2013.01); *H04B 1/40* (2013.01)

(58) Field of Classification Search
CPC .................................. H03L 7/0992; H04B 1/40
See application file for complete search history.

(56) References Cited

U.S. PATENT DOCUMENTS

| | | | | |
|---|---|---|---|---|
| 5,448,193 A | * | 9/1995 | Baumert et al. | 327/156 |
| 7,449,928 B2 | * | 11/2008 | Kobayashi | 327/156 |
| 8,442,466 B2 | * | 5/2013 | Trikha et al. | 455/260 |
| 2004/0198288 A1 | | 10/2004 | Sadowski | |
| 2009/0156158 A1 | | 6/2009 | Kang et al. | |
| 2010/0134192 A1 | * | 6/2010 | Min et al. | 331/34 |
| 2011/0316639 A1 | | 12/2011 | Fischette | |
| 2014/0184291 A1 | * | 7/2014 | Yang et al. | 327/156 |

FOREIGN PATENT DOCUMENTS

| | | |
|---|---|---|
| KR | 2001-0032271 A | 4/2001 |
| KR | 10-2007-0012798 A | 1/2007 |
| KR | 10-0929795 B1 | 12/2009 |
| KR | 10-0935969 B1 | 1/2010 |
| KR | 10-2012-0023069 A | 3/2012 |
| KR | 10-2012-0023997 A | 3/2012 |
| KR | 10-1247029 B1 | 3/2013 |
| KR | 10-2013-0065724 A | 6/2013 |

* cited by examiner

*Primary Examiner* — Dac Ha
(74) *Attorney, Agent, or Firm* — NSIP Law

(57) ABSTRACT

A phase-locked loop (PLL) includes a counter configured to measure voltage-controlled oscillator (VCO) information of an oscillator during a mask time, and a frequency tuner configured to tune a frequency of the oscillator to a target frequency, based on a comparison result obtained by comparing the VCO information to target frequency information.

20 Claims, 8 Drawing Sheets

100

DIGITAL PHASE-LOCKED LOOP (DPLL), METHOD OF CONTROLLING DPLL, AND ULTRA LOW POWER (ULP) TRANSCEIVER USING DPLL

CROSS-REFERENCE TO RELATED APPLICATION

This application claims the benefit under 35 USC 119(a) of Korean Patent Application No. 10-2014-0006934, filed on Jan. 20, 2014, in the Korean Intellectual Property Office, the entire disclosure of which is incorporated herein by reference for all purposes.

BACKGROUND

1. Field

The following description relates to a digital phase-locked loop (DPLL), a method of controlling a DPLL, and an ultra low power (ULP) transceiver using a DPLL.

2. Description of Related Art

Generally, a radio frequency (RF) transceiver consumes the most power in an ultra low power (ULP) system. Additionally, RF blocks of an RF analog device consume the most power in the RF transceiver. In the ULP system, a power amplifier consumes less power due to a short signal arrival distance, whereas a voltage-controlled oscillator (VCO) and a phase-locked loop (PLL) consume more power. Furthermore, because power is applied to the PLL and the VCO all the time in most RF transceivers, a large amount of power may be consumed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a phase-locked loop (PLL), including a counter configured to measure voltage-controlled oscillator (VCO) information of an oscillator during a mask time, and a frequency tuner configured to tune a frequency of the oscillator to a target frequency, based on a comparison result obtained by comparing the VCO information to target frequency information.

The PLL may further include a comparator configured to compare the VCO information to the target frequency information, to obtain the comparison result.

The PLL may further include a timing generator configured to divide a reference frequency, and provide a timing signal to be used to operate the counter, the comparator, and the frequency tuner, based on the divided reference frequency.

The PLL may further include a mapping table configured to store, in advance, the target frequency information of each of frequencies that corresponds to the mask time, among frequencies in a predetermined range.

The target frequency information may include either one or both of a number of times the oscillator oscillates during a mask time needed to coarsely tune the frequency of the oscillator and corresponding to the target frequency, and a number of times the oscillator oscillates during a mask time needed to finely tune the frequency of the oscillator and corresponding to the target frequency.

The frequency tuner may include a first tuning controller configured to coarsely tune the frequency of the oscillator to the target frequency, based on the comparison result, and a second tuning controller configured to finely tune the frequency of the oscillator to the target frequency, based on the comparison result.

In response to the frequency of the oscillator matching the target frequency, the PLL may be configured to supply power to the frequency tuner to be used to maintain the frequency of the oscillator matching the target frequency.

The VCO information may include either one or both of the frequency of the oscillator, and a number of times the oscillator oscillates during the mask time, and the counter may be configured to count the number of times the oscillator oscillates.

The PLL may further include the oscillator configured to oscillate at the tuned frequency during a data transmission and reception time.

In another general aspect, there is provided a method of controlling a phase-locked loop (PLL), the method including measuring voltage-controlled oscillator (VCO) information of an oscillator during a mask time, and tuning a frequency of the oscillator to a target frequency, based on a comparison result obtained by comparing the VCO information to target frequency information.

The method may further include comparing the VCO information to the target frequency information, to obtain the comparison result.

The method may further include dividing a reference frequency, and providing a timing signal to be used to operate the PLL, based on the divided reference frequency.

The method may further include storing, in advance, the target frequency information of each of frequencies that corresponds to the mask time, among frequencies in a predetermined range.

The tuning may include coarsely tuning the frequency of the oscillator to the target frequency, based on the comparison result, and finely tuning the frequency of the oscillator to the target frequency, based on the comparison result.

The method may further include in response to the frequency of the oscillator matching the target frequency, supplying power to be used to maintain the frequency of the oscillator matching the target frequency.

The measuring may include counting the number of times the oscillator oscillates.

The method may further include oscillating at the tuned frequency during a data transmission and reception time.

In still another general aspect, there is provided an ultra low power (ULP) transceiver with a phase-locked loop (PLL), the ULP transceiver including a reception (Rx) path configured to receive data in an Rx mode, and a transmission (Tx) path configured to transmit data in a Tx mode. The ULP transceiver further includes the PLL configured to measure voltage-controlled oscillator (VCO) information of an oscillator during a mask time of the Rx mode and the Tx mode, and tune a frequency of the oscillator to a target frequency, based on a comparison result obtained by comparing the VCO information to target frequency information.

In response to the frequency of the oscillator matching the target frequency, the PLL may be configured to supply power to be used to maintain the frequency of the oscillator matching the target frequency.

In yet another general aspect, there is provided a phase-locked loop (PLL), including a counter configured to count a number of times an oscillator oscillates during a mask time, and a comparator configured to compare the number of times the oscillator oscillates to a target number of times the oscillator oscillates that corresponds to a target frequency. The PLL further includes a frequency tuner configured to tune a frequency of the oscillator to the target frequency, based on the comparison.

The target number of times the oscillator oscillates may be during a coarse mask time needed to coarsely tune the frequency of the oscillator, or a fine mask time needed to finely tune the frequency of the oscillator.

The frequency tuner may include a first tuning controller configured to coarsely tune the frequency of the oscillator to the target frequency for a first period, based on the comparison, and a second tuning controller configured to finely tune the frequency of the oscillator to the target frequency for a second period greater than the first period, based on the comparison.

Other features and aspects will be apparent from the following detailed description, the drawings, and the claims.

Figure 1:
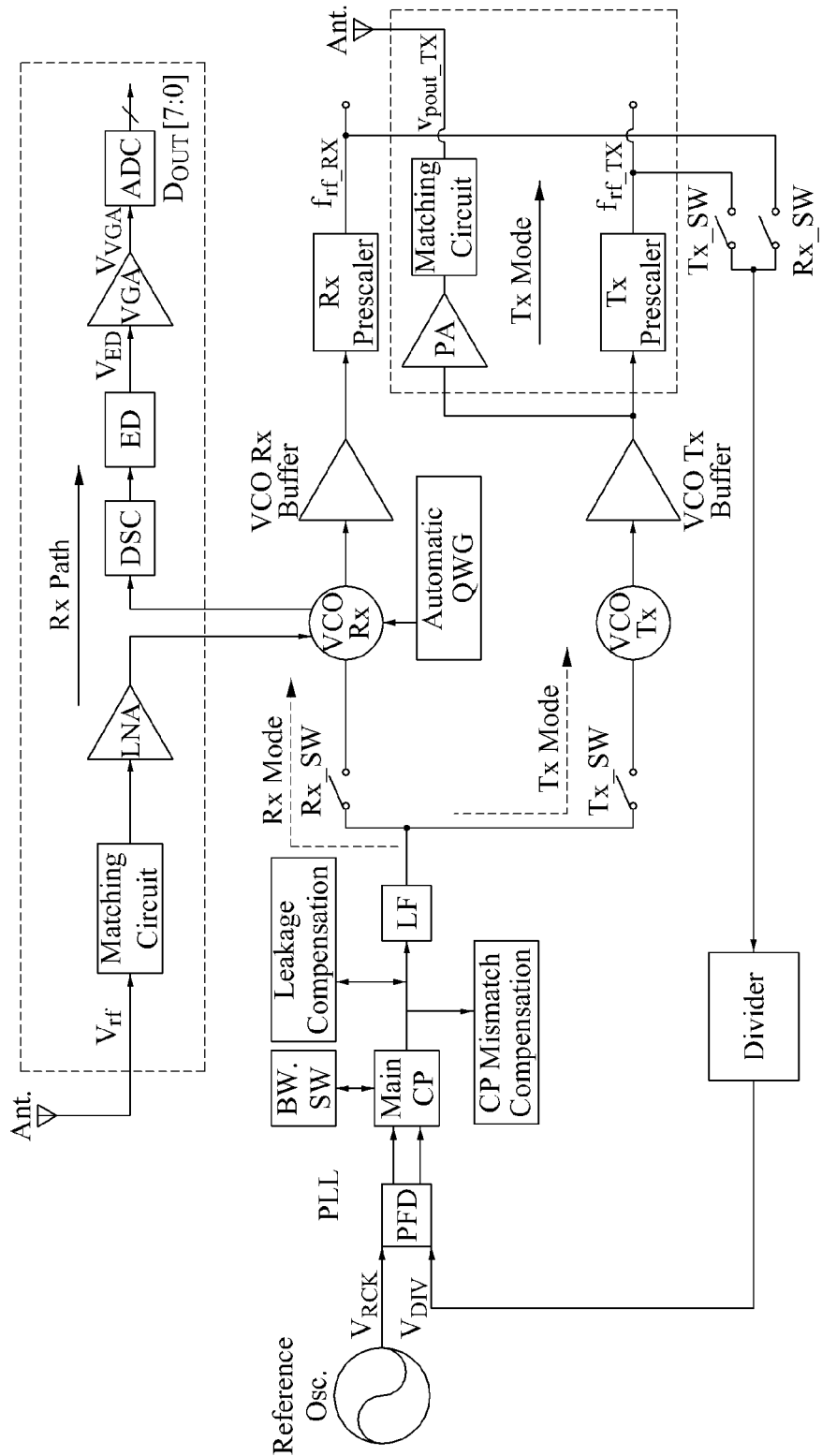
FIG. 1 is a diagram illustrating a transceiver using an analog phase-locked loop (APLL) according to a related art.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 illustrates a transceiver 100 using an analog phase-locked loop (APLL) according to a related art. Typically, a radio frequency (RF) transceiver may consume the most power in an ultra low power (ULP) monitoring system. Additionally, a low-noise amplifier (LNA) and a synthesizer used in the RF transceiver may consume the most power. Furthermore, the RF transceiver may occupy a considerable area in view of the whole circuit area.

The transceiver 100 of FIG. 1 is configured based on a super-regenerative oscillator (SRO). Hereinafter, a "transceiver configured based on an SRO" may be referred to as an "SRO transceiver." A frequency synthesizer of the SRO may include, for example, an APLL. As illustrated in FIG. 1, the APLL includes a phase frequency detector (PFD), a main charge pump (CP), a loop filter (LF), a leakage compensation unit, and a divider.

The APLL of the SRO transceiver 100 also includes a CP mismatch compensation unit, an automatic quenching waveform generator (QWG), a reception (Rx) prescaler, a transmission (Tx) prescaler, and a matching circuit. Additionally, an Rx path of the SRO transceiver 100 includes a differential single-ended converter (DSC), an envelope detector (ED), a variable gain amplifier (VGA), and an analog-to-digital converter (ADC).

For example, referring to FIG. 1, frequency information of a voltage-controlled oscillator (VCO) may be compared to a reference frequency in the PFD, a control voltage of the VCO may be adjusted in the main CP, and accordingly, frequency locking may be performed. When a current of the VCO is on or off in an Rx mode, frequency locking may not be performed, and accordingly, the control voltage may be maintained in the leakage compensation unit. However, in the leakage compensation unit, a large amount of power may be consumed, and accuracy may be reduced.

Typically, in an APLL, an accurate local oscillation (LO) signal may be generated. However, because a PLL may not operate in the Rx mode in the SRO transceiver 100 as illustrated in FIG. 1, the PLL may need to be turned off, which may reduce accuracy. Additionally, the APLL of the SRO transceiver 100 may consume an extremely large amount of power, and may occupy a considerable area.

Additionally, a receiver based on an SRO structure using an APLL may include a frequency synthesizer configured to lock a desired frequency using the APLL, to digitalize and store corresponding frequency information, and to use the stored frequency information in the Rx mode. Accordingly, because a VCO current may be on and off in the Rx mode despite the APLL being applied, the APLL may not continue to operate. As a result, during digitalizing after frequency locking, accuracy may be reduced.

In all digital PLLs (DPLLs), a unit that consumes more power and occupies a larger area, for example, a time-to-digital converter (TDC) and a digital filter, may be needed. In an example, by applying a DPLL to a transceiver, a structure enabling operations to be independently performed in an Rx mode while reducing power consumption and an area may be implemented. For example, a DPLL may be innovatively enhanced compared to an APLL, in view of power consumption and an area. Additionally, when a desired frequency is locked through a DPLL, most units of the DPLL may be turned off, and thus, overall average power consumption may be enhanced.

A DPLL according to various examples may not use a unit needing high power consumption and a large area, for example, a PFD, a CP, a prescaler, and a leakage compensation unit, which are included in an APLL, or a TDC included in all DPLLs. For example, the DPLL may include a digital circuit that consumes less power and occupies a smaller area, for example, a counter, a comparator, and a mapping table. The mapping table may include, for example, a register.

Figure 2:
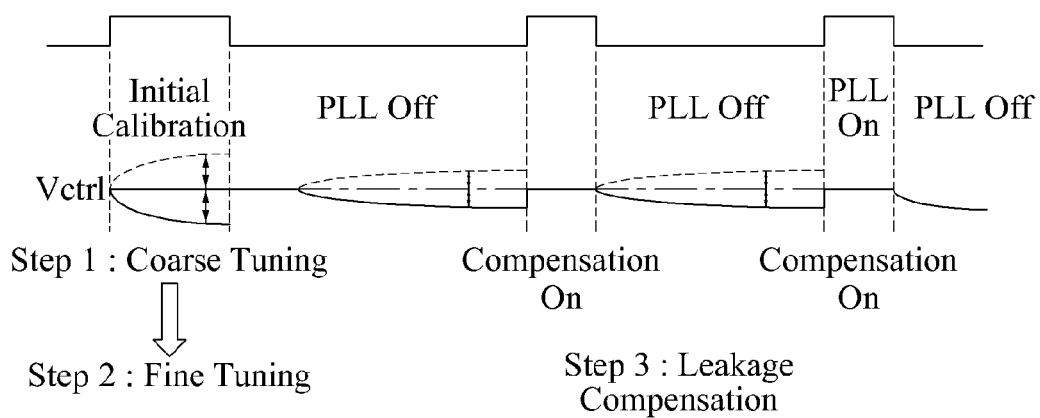
FIG. 2 is a timing diagram illustrating an operation of an APLL according to a related art.

FIG. 2 illustrates an example of an operation of an APLL according to a related art. FIG. 2 illustrates a timing diagram of an operation of an APLL in an SRO transceiver. When initial PLL locking is performed, a PLL, for example the APLL, may not operate in an Rx mode, a large amount of power may be consumed, and accordingly, the PLL may not be turned on at all times. For example, when coarse tuning and fine tuning are performed during initial calibration, the PLL may be turned off.

Through an operation of the leakage compensation unit of FIG. 1, a change in a control voltage due to leakage may be compensated for during an off period of the PLL (Compensation on). However, referring to FIG. 2, when compensation is performed, a problem of accuracy may occur. Because compensation may be additionally performed by a predetermined clock timing, a spur component may be generated to reduce performance of phase noise in performance of the PLL.

Additionally, a large amount of power may be consumed by an ADC, a comparator, and an operation amplifier that are used in the leakage compensation unit.

Figure 3:
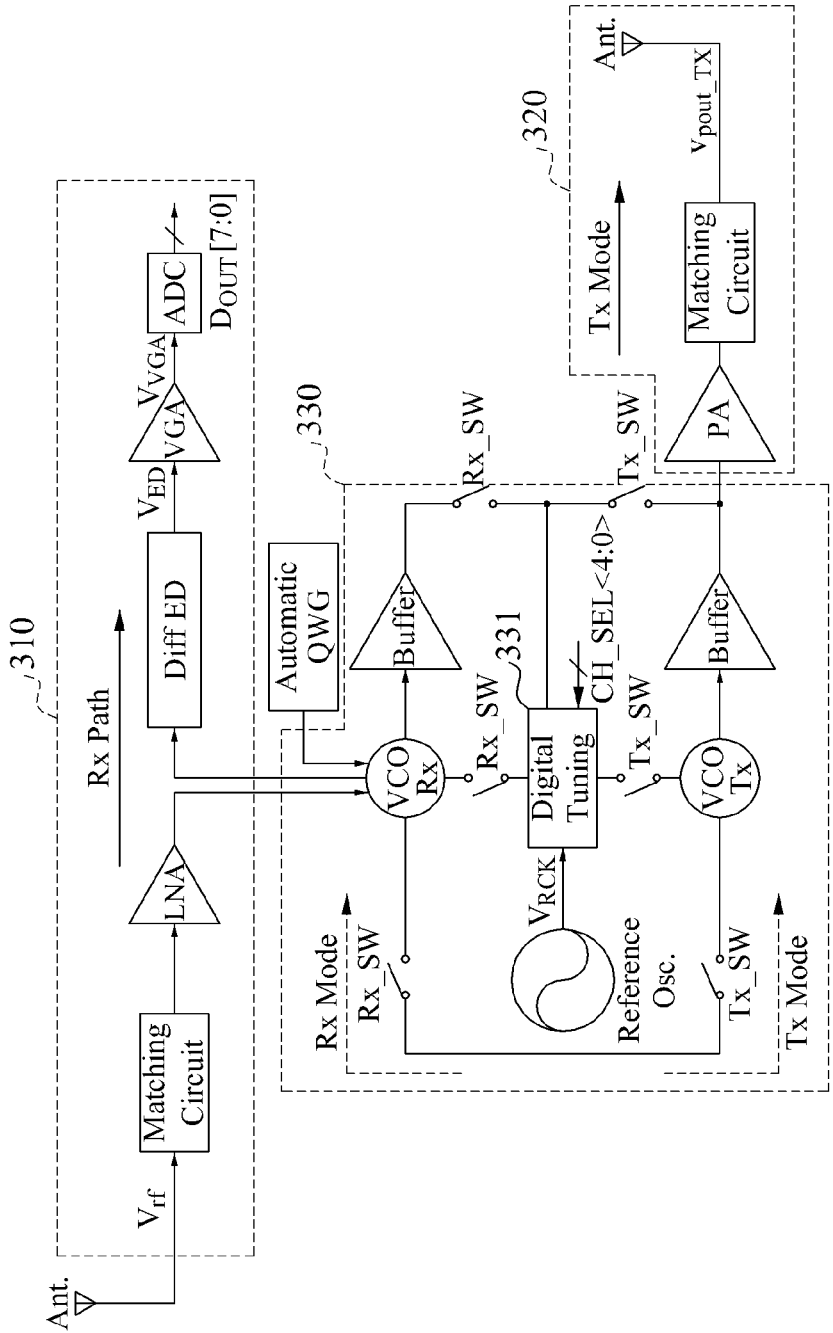
FIG. 3 is a diagram illustrating an example of an ultra low power (ULP) transceiver using a digital PLL (DPLL).

FIG. 3 illustrates an ULP transceiver 300 using a DPLL 330. The ULP transceiver 300 of FIG. 3 includes an Rx path 310, a Tx path 320, and the DPLL 330. The Rx path 310 is configured to receive data in an Rx mode. The Tx path 320 is configured to transmit data in a Tx mode. The DPLL 330 is configured to measure VCO information for an oscillator during a mask time in each of the Rx mode and the Tx mode, and to tune a frequency of the oscillator to a target frequency based on a comparison result obtained by comparing the VCO information to target frequency information that is stored in advance in a mapping table.

The Rx path 310 may include, for example, an SRO. Different oscillators may be used in the Rx path 310 and the Tx path 320. The frequency of the oscillator is tuned by a digital tuning unit 331.

The ULP transceiver 300 may be configured, for example, based on an SRO scheme. Switching is performed based on the Rx mode and the Tx mode, and accordingly, the ULP transceiver 300 is configured to act as a single DPLL circuit, for example, the DPLL 330. In the ULP transceiver 300, the Rx path 310 operates in the Rx mode, and the Tx path 320 operates in the Tx mode.

In an example, the DPLL 330 counts a number of times an oscillator oscillates during a mask time (e.g., a time in which a mask signal is provided) based on a frequency that is initially set in the oscillator. In this example, the DPLL 330 tunes the oscillator to operate at a target frequency, for example, a desired frequency. The oscillator may include a capacitor back used to tune a frequency. The capacitor bank may include, for example, a metal-oxide-silicon (MOS) capacitor. In this example, the DPLL 330 may be configured to perform tuning sequentially from a most significant bit (MSB) to a least significant bit (LSB) of a control code used to control the capacitor bank, so that the oscillator may have a desired frequency.

The desired frequency is selected by a channel selection signal, for example, CH_SEL<4:0>. By changing a value of the channel selection signal, an internal reference value of the DPLL 330 is changed. The internal reference value may be, for example, a correct value to be obtained by counting during a mask time. The channel selection signal CH_SEL<4:0> may include five bits; however, there is no limitation thereto. For example, a channel selection signal may include at least two bits.

In detail, "<x:0>" described in a rear portion of a variable indicates that the variable includes bits from "0" to "x", that is, "x+1" bits. Bits of a variable are merely an example, and accordingly, may be changed based on a design.

When frequency tuning is completed by the DPLL 330 through the above-described operation, the ULP transceiver 300 may operate based on the Rx mode and the Tx mode.

In an example, a frequency synthesizer used in the ULP transceiver 300 is implemented using the DPLL 330, instead of using a typical APLL. In an APLL, an extremely large amount of power may be consumed, and a considerable area may be occupied by a frequency synthesizer included in a transceiver in a band of 2.4 gigahertz (GHz). Additionally, because an APLL may not continue to operate in an Rx mode in an SRO structure as described above, it may be difficult to satisfy frequency accuracy. The DPLL 330 may include a digital unit, for example, a counter, a comparator, and a register, and accordingly, less power may be consumed and a smaller area may be occupied.

The capacitor bank of the oscillator may be adjusted based on a result of counting the number of times the oscillator oscillates during the mask time, and accordingly, it is possible to design the ULP transceiver 300 to satisfy a processing time of the DPLL 330, a processing time needed by a frequency resolution in various application fields, and accuracy. The frequency resolution may be determined, for example, based on a number of capacitors included in the capacitor bank.

In an example, the counter (e.g., a digital counter) may count outputs of the oscillator, of which the frequency is determined based on an initial capacitance (e.g., an initial value of a capacitor of the capacitor bank), during a mask time or a masking interval. In this example, the DPLL 330 may compare counted VCO information to target frequency information in a mapping table that is defined for each frequency. The DPLL 330 may adjust the capacitor bank of the oscillator based on a result of the comparison, and may tune the frequency of the oscillator to a desired frequency, for example, a target frequency.

When all operations of the DPLL 330 are completed, the DPLL 330 may minimize power consumption by turning off all blocks other than a register. The register may be configured to maintain a control bit of the capacitor bank that may correspond to, for example, a value of a predetermined capacitor.

Frequency accuracy may be configured based on a time in which the number of times the oscillator oscillates is counted (e.g., a mask time), or based on a frequency resolution of the capacitor bank. For example, as a mask time increases, an error between the frequency of the oscillator locked by the DPLL 330 and a desired target frequency may decrease. In another example, as the number of capacitors included in the capacitor bank increases, the error between the frequency of the oscillator locked by the DPLL 330 and the target frequency may decrease. For example, the number of capacitors may be in proportion to a control bit of the capacitor bank.

The DPLL 330 may be designed for various application fields by adjusting frequency accuracy, for example. Thus, the DPLL 330 may have technical scalability to various application fields. As the frequency accuracy increases, the error between the frequency of the oscillator locked by the DPLL 330 and the target frequency may decrease.

Figure 4:
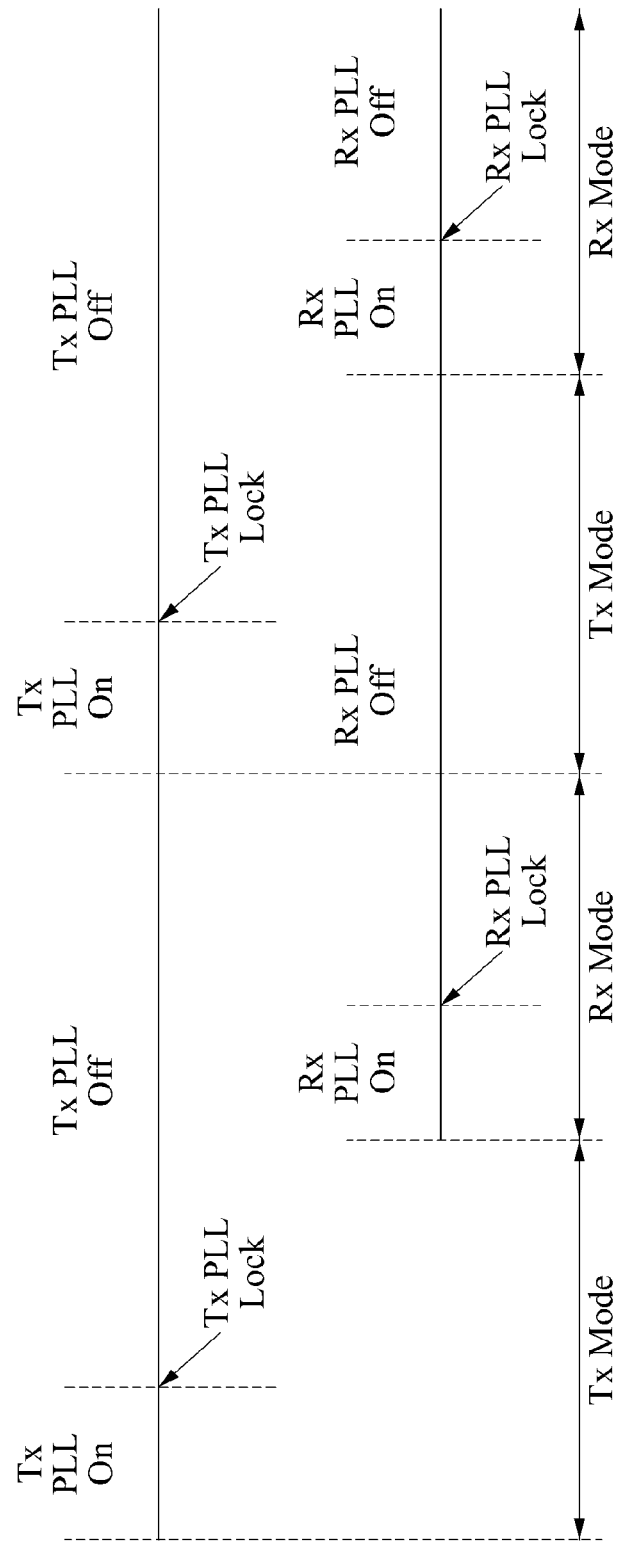
FIG. 4 is a timing diagram illustrating an example of an operation of a transceiver for each mode.

FIG. 4 illustrates examples of an operation of a transceiver for each mode. FIG. 4 illustrates an overall timing diagram of an SRO transceiver. For example, switching between a Tx mode and an Rx mode is performed. In this example, a PLL performs locking (e.g., Tx PLL lock, and Rx PLL lock) during a predetermined period of time (e.g., Tx PLL On, and Rx PLL On). When the locking is performed in the Tx mode and the Rx mode, the SRO transceiver turns the PLL off (e.g., Tx PLL Off, and Rx PLL Off) while maintaining a value of a capacitor of a capacitor bank that is determined by the locking operation, and accordingly, overall average power consumption may be minimized.

Figure 5:
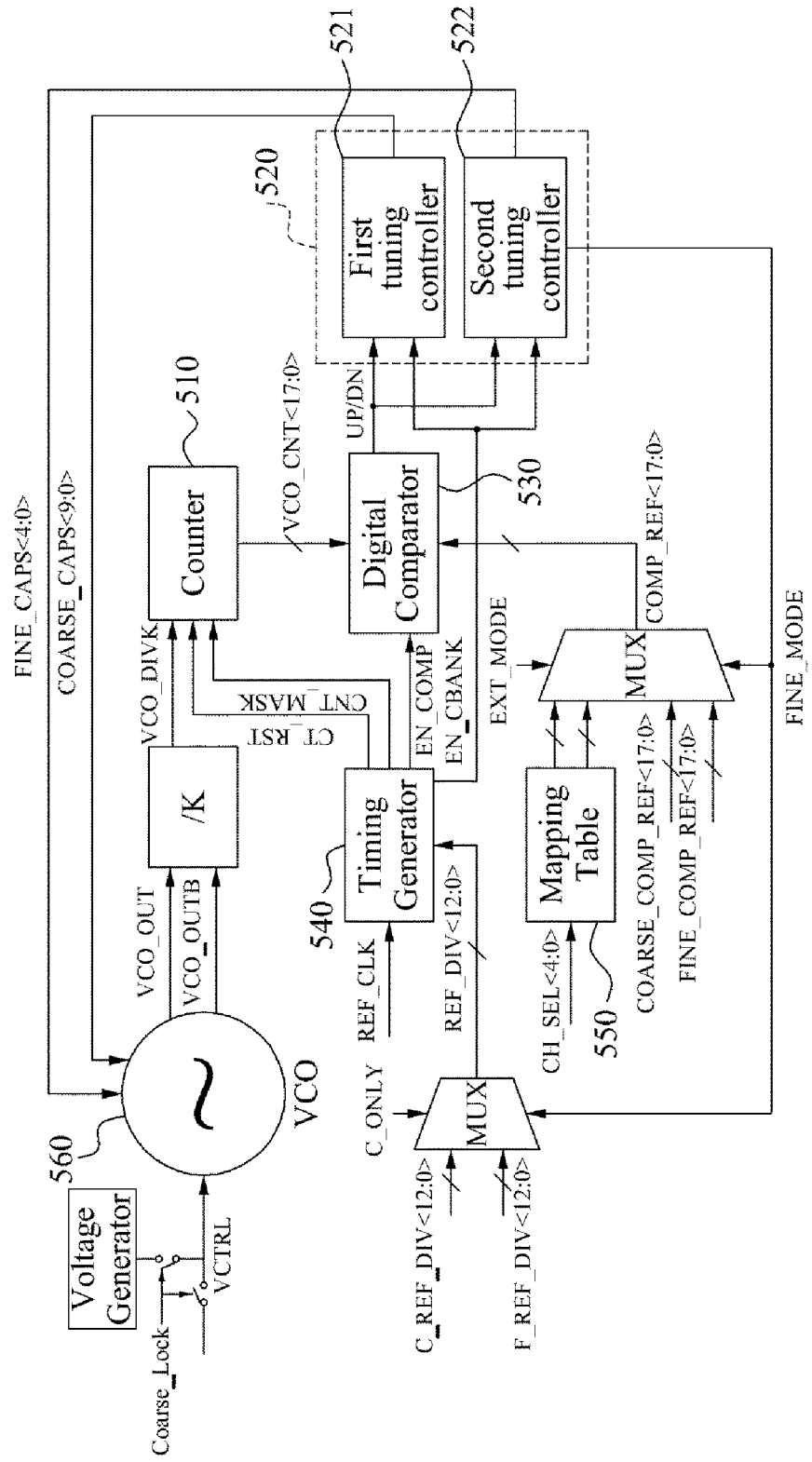
FIG. 5 is a diagram illustrating an example of a DPLL.

FIG. 5 illustrates an example of a DPLL 500. Referring to FIG. 5, the DPLL 500 includes a counter 510, a frequency tuner 520, a digital comparator 530, a timing generator 540, a mapping table 550, and an oscillator 560, for example, a VCO. For example, when a frequency of the oscillator 560 matches a target frequency, the DPLL 500 may supply power to only the frequency tuner 520.

The counter 510 measures VCO information for the oscillator 560 during a mask time. The VCO information may include, for example, the frequency of the oscillator 560, and a number of times the oscillator 560 oscillates during the mask time (e.g., VCO_CNT<17:0>). For example, the counter 510 may count the number of times the oscillator 560 oscillates during the mask time.

The counter 510 may be, for example, an 18-bit counter. In the following description, the counter 510 counts output signals of the oscillator 560 that are divided (e.g., VCO_DIVK) during a predetermined period of time. A time in which the counter 510 performs counting is enabled by a signal CNT_MASK of the timing generator 540. Additionally, a time in which the signal CNT_MASK is applied corresponds to a mask time.

An output from the oscillator 560 to the counter 510 is divided by a divider "/K." "K" may be, for example, "2". For example, when "K" is set to "2", the divider may divide, by "2", output signals of the oscillator 560 (e.g., VCO_OUT and VCO_OUTB). In an example of a high frequency, the counter 510 may not normally operate. Accordingly, the DPLL 500 divides a frequency of an output signal of the oscillator 560 by a predetermined size (e.g., K), and inputs the divided frequency to the counter 510. The divider may be represented as a prescaler, for example.

A bit number of the counter 510 may be determined based on a target frequency that is to be calibrated by the DPLL 500, and based on a tolerance for a frequency error. To have a frequency error that is less than or equal to a predetermined value, the counter 510 may need to have a resolution to return different numbers of times oscillations occur for frequencies having a difference corresponding to the frequency error during a mask time (e.g., CNT_MASK). The resolution may refer to a resolution of a frequency.

In an example, a target frequency range of about 2.2 GHz to about 2.8 GHz may be needed by a transceiver. In this example, the output signal of the oscillator 560 may be divided by "2", and accordingly, a frequency f_vco/2 input to the counter 510 may be in a range of 1.1 GHz to 1.4 GHz. Additionally, an 18-bit counter may be used to count the divided output signal of the oscillator 560 at a frequency resolution of 10 kilohertz (kHz) for 100 microseconds (μs), without an overflow.

The frequency tuner 520 tunes the frequency of the oscillator 560 to a target frequency based on a comparison result obtained by comparing the VCO information to target frequency information stored in advance in the mapping table 550. The frequency tuner 520 may include a first tuning controller 521 and a second tuning controller 522. The first tuning controller 521 may be configured to coarsely tune the frequency of the oscillator 560 based on the comparison result. The second tuning controller 522 may be configured to finely tune the frequency of the oscillator 560 based on the comparison result. For example, an output of the first tuning controller 521 may be represented as COARSE_CAPS<9:0> with 10 bits, and an output of the second tuning controller 522 may be represented as FINE_CAPS<4:0> with 5 bits.

The digital comparator 530 compares the target frequency information to the VCO information, and provides the frequency tuner 520 with the comparison result (e.g., UP/DN). For example, the digital comparator 530 may compare the target frequency information to the VCO information from an MSB to an LSB.

An operation of the digital comparator 530 will be further described below. In the following description, the digital comparator 530 may be referred to as the comparator 530.

For example, the comparator 530 compares a value obtained by counting output signals of the oscillator 560 during a time set by the signal CNT_MASK (e.g., a mask time) to a value provided by COMP_REF (e.g., COMP_REF <17:0>). The value obtained by the counting may be, for example, the number of times the oscillator 560 oscillates, and the value provided by COMP_REF may be, for example, the number of times the oscillator 560 oscillates during a mask time that corresponds to the target frequency. In this example, the comparator 530 outputs information regarding whether a frequency of the output signal of the oscillator 560 is higher or lower than the target frequency (e.g., UP/DN).

In this example, COMP_REF is an output of a multiplexer (MUX) when a channel code extracted from the mapping table 550, and externally supplied channel data (e.g., COARSE_COMP_REF<17:0> and FINE_COMP_REF<17:0>), are selected in the MUX. A value of COMP_REF may correspond to the target frequency, for example, a desired frequency in the DPLL 500. The channel code and the channel data may each have, for example, 18 bits, and COMP_REF may be represented as COMP_REF<17:0>. However, 18 bits are merely an example, and accordingly, COMP_REF may not be limited to 18 bits.

The timing generator 540 divides a reference frequency (e.g., REF_CLK), and provides a timing signal used to allow the counter 510, the frequency tuner 520, and the comparator 530 to operate. The timing signal may include, for example, CT_RST, CNT_MASK, EN_COMP, and EN_CBANK.

The mapping table 550 stores, in advance, target frequency information of each of frequencies corresponding to the mask time, among frequencies in a predetermined range. The target frequency information may include, for example, the number of times the oscillator 560 oscillates during a mask time needed to coarsely tune the frequency of the oscillator 560 and corresponding to the target frequency, and/or the number of times the oscillator 560 oscillates during a mask time needed to finely tune the frequency of the oscillator 560 and corresponding to the target frequency. In an example in which the frequency of the oscillator 560 is coarsely tuned, a relatively short mask time may be set, because the frequency of the oscillator 560 and the target frequency need to be coarsely compared. In another example in which the frequency of the oscillator 560 is finely tuned, a relatively long mask time may be set, because the frequency of the oscillator 560 and the target frequency need to be finely compared.

For example, the number of times the oscillator 560 oscillates during the mask time corresponding to the target frequency may be represented as an 18-bit code corresponding to the target frequency, for example, a desired channel. The target frequency information may be represented as shown in Tables 1 and 2 below.

The oscillator 560 oscillates at a frequency tuned by the frequency tuner 520. For example, the oscillator 560 may include a capacitor bank. The capacitor bank may include a MOS capacitor. For example, when the capacitor bank includes "n" capacitors, the frequency of the oscillator 560 may be tuned based on "n" control bits provided by the frequency tuner 520. In this example, the "n" control bits may respectively correspond to the "n" capacitors, a control bit with a value of "1" may indicate an on state of a corresponding capacitor, and a control bit with a value of "0" may indicate an off state of a corresponding capacitor. Additionally, "n" may be a natural number greater than or equal to "1".

The comparator 530 counts output signals of the oscillator 560 during a mask time. The mask time may be extracted by dividing a reference clock REF_CLK.

In an example, VCO information, for example, the counted number of times the oscillator 560 oscillates may be input to the comparator 530. Target frequency information of a target frequency determined by CH_SEL<4:0> (e.g., the number of times the oscillator 560 oscillates at a target frequency during a mask time) may be input to the comparator 530.

In this example, the comparator 530 may compare the VCO information to the target frequency information from an MSB to an LSB. Additionally, the comparing may be performed through two processes, for example, coarse tuning and fine tuning. In the coarse tuning needing relatively low accuracy, a value of a capacitor in a capacitor bank may be searched for during a relatively short period of time. In the fine tuning, a value of a capacitor in a capacitor bank may be searched for during a relatively long period of time, to increase accuracy.

For example, the first tuning controller 521 may be configured to control on and off states of a coarse capacitor, that is, a capacitor in the range from 15 bits to 6 bits. The second tuning controller 522 may be configured to control on and off states of a fine capacitor, that is, a capacitor in the range from 5 bits to 1 bit.

Referring to FIG. 5, a reference clock REF_CLK may represent all operation clocks of the DPLL 500, including CNT_MASK. For generation of CNT_MASK, REF_DIV may be multiplied by a period of REF_CLK, to derive a mask time, using equation "Mask time=(Period of REF_CLK)× (REF_DIV)=Tref_clk×REF_DIV". For example, REF_DIV may have a bit width of 12 bits to generate a mask time of 100 μs, with respect to REF_CLK of 24 megahertz (MHz). REF_DIV may be, for example, an output of an MUX that receives, as inputs, C_REF_DIV<12:0>, F_REF_DIV<12: 0>, and C_ONLY.

CNT_MASK may refer to a time during which the counter 510 counts output signals of the oscillator 560 with a frequency f_vco/K, and may correspond to a mask time. The signal CNT_MASK may be provided from the timing generator 540 to the counter 510. EN_COMP may be an enable signal to enable an output signal of the counter 510 to be compared to target frequency information of a target frequency and that is stored in the mapping table 550. EN_CBANK may be an enable signal to enable a value of a capacitor in a capacitor bank to be adjusted based on an output of the comparator 530. CT_RST may be a signal to reset the counter 510 before the signal CNT_MASK is input to the counter 510.

Figure 6:
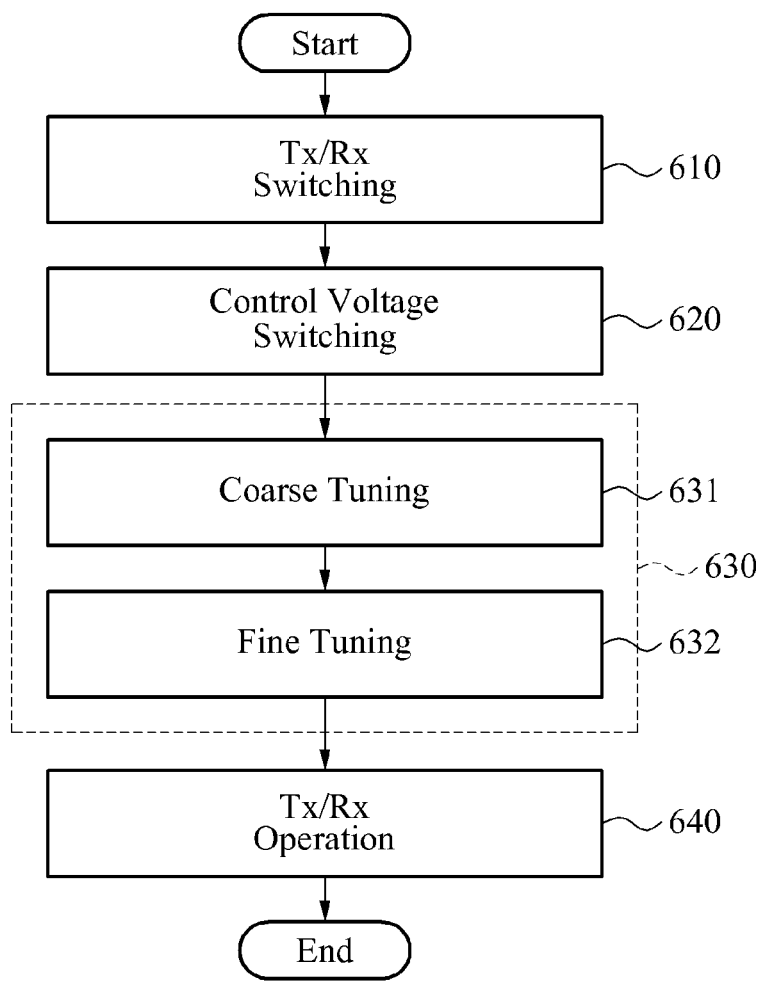
FIG. 6 is a diagram illustrating an example of a state of a transceiver.

FIG. 6 illustrates an example of a state of a transceiver. Referring to FIG. 6, in operation 610, the transceiver performs switching to a Tx mode or an Rx mode.

In operation 620, the transceiver performs control voltage switching. A control voltage (e.g., VCTRL) is a voltage used to control a frequency of an oscillator and received from a voltage generator. A PLL may lock a control voltage of an oscillator to a desirable value.

In operation 630, the transceiver performs an operation of a DPLL. For example, the DPLL may match a frequency of an oscillator to a target frequency through coarse tuning in operation 631 and/or fine tuning in operation 632, and may lock the target frequency, which may indicate completion of the operation of the DPLL.

In operation 640, the transceiver performs a Tx operation and an Rx operation. For example, the transceiver may operate in the Tx mode or the Rx mode, using a minimum amount of power by turning off the DPLL.

Figure 7:
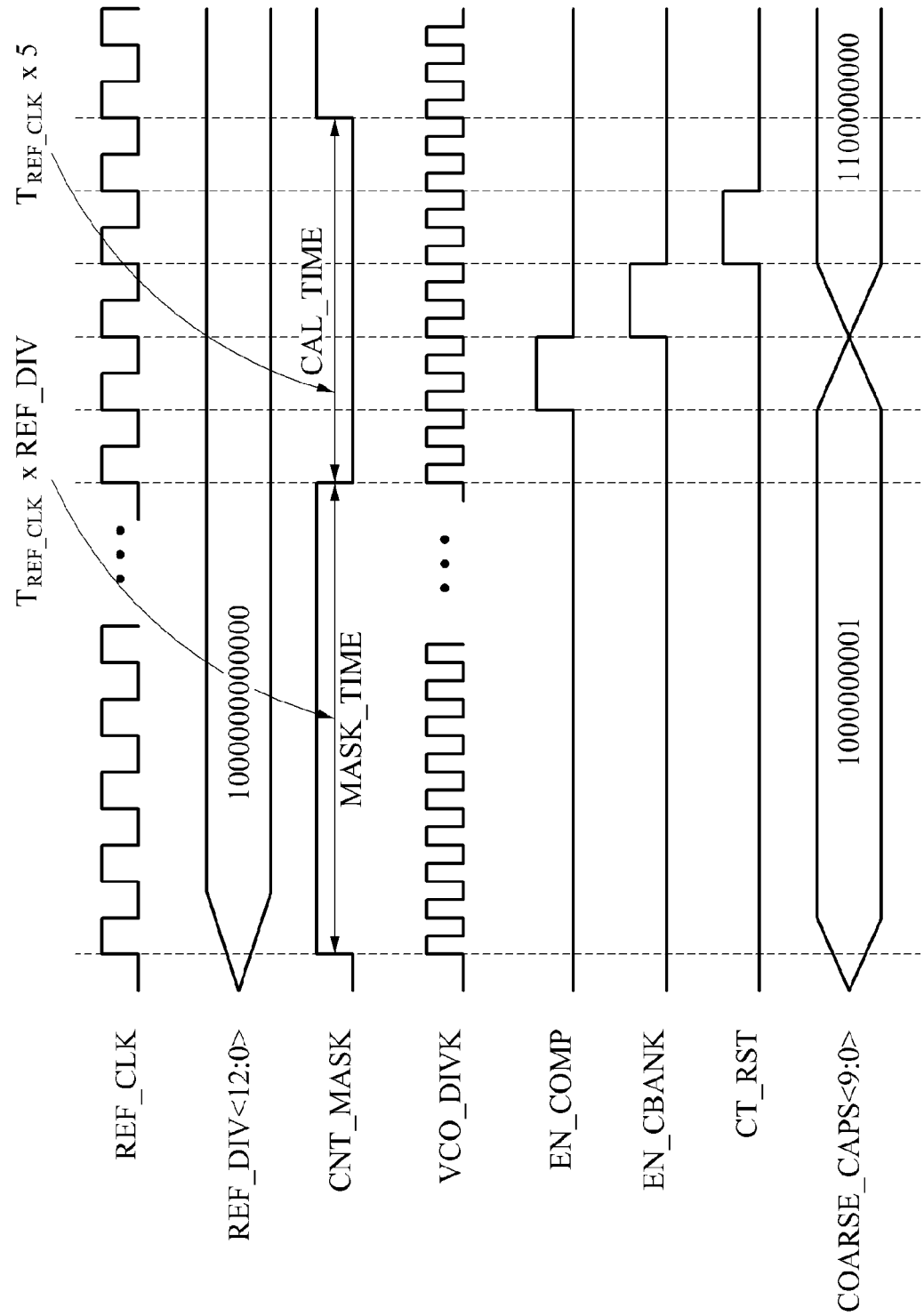
FIG. 7 is a timing diagram illustrating an example of an operation of a DPLL.

FIG. 7 illustrates an example of an operation of a DPLL. Referring to FIG. 7, the DPLL counts a frequency of an oscillator during a mask time MASK_TIME, performs calculation during a calculation time CAL_TIME, and sets a value of a capacitor in a capacitor bank. The calculation may include, for example, comparing the frequency of the oscillator to a target frequency, and determining whether to tune the frequency of the oscillator up or down. A control voltage of the oscillator may be locked, instead of being periodically controlled as described in FIG. 2, and accordingly, the DPLL may operate when initial reset is performed or when a channel is changed. Therefore, the DPLL may consume less power, compared to the APLL of FIG. 1, and a spur component may not be generated.

In FIG. 7, during the calculation time CAL_TIME, a signal EN_COMP is applied to a comparator, a signal EN_CBANK is applied to a frequency tuner, and a signal CT_RST is applied to a counter. The calculation time CAL_TIME is set as "$T_{REF\_CLK} \times 5$". However, there is no limitation thereto, and accordingly, the calculation time may be set as a time during which an operation of each of the comparator, the frequency tuner, and the counter is completed, and the DPLL is reset.

Additionally, in FIG. 7, during an interval (e.g., MASK_TIME) in which a signal CNT_MASK generated by dividing a reference clock (e.g., a reference frequency) has a high value, the counter may count output signals of the oscillator (e.g., a number of times the oscillator oscillates). During an interval (e.g., CAL_TIME) in which the signal CNT_MASK has a low value, the comparator may compare a value stored in the mapping table to an output of the counter (e.g., VCO_CNT<17:0>, that is, a value obtained by counting of the counter), and may perform calculation. In this example, based on an output of the comparator, the frequency tuner may control capacitors in the capacitor bank sequentially from a capacitor corresponding to an MSB to a capacitor corresponding to an LSB, and may tune the frequency of the oscillator to a desired frequency value (e.g., a target frequency). The output of the comparator may include, for example, signals UP and DN, as a result obtained by comparing the number of times the oscillator oscillates to the number of times the oscillator oscillates at a target frequency. For example, when the capacitor bank has 15 bits, a timing interval (for example, MASK_TIME and CAL_TIME in FIG. 7) may be repeated 15 times.

In an example, accuracy and a processing speed may be set by changing an interval of the signal CNT_MASK based on application fields. For example, when different mask times are applied to a 10-bit coarse capacitor and a 5-bit fine capacitor, a locking time needed by a PLL to lock a frequency may be represented by equation "Locking Time=10×(MASK_TIME$_{coarse}$ CAL_TIME)+5×(MASK_TIME$_{fine}$+CAL_TIME)". In this equation, MASK_TIME$_{coarse}$ denotes a mask time applied to a coarse capacitor, and MASK_TIME$_{fine}$ denotes a mask time applied to a fine capacitor.

Table 1 shows a mapping table configured to store, in advance, target frequency information corresponding to a desired target frequency in coarse tuning. Table 2 shows a mapping table configured to store, in advance, target frequency information corresponding to a desired target frequency in fine tuning.

In an example, a mask time may be set based on REF_DIV. Referring to Tables 1 and 2, a value of REF_DIV in coarse tuning of Table 1 is less than that of fine tuning of Table 2. Additionally, a value of REF_CNT may be, for example, the number of times an oscillator oscillates at a target frequency during a mask time (for example, an actually desired correct value). The DPLL may compare an output of the counter to the value of REF_CNT, and may tune the frequency of the oscillator to the target frequency.

For example, the value of REF_CNT may be stored in advance in a mapping table. For example, REF_CNT may be represented by equation $$\text{REF\_CNT} = \frac{1}{\text{REF\_CLK}} \times \text{REF\_DIV} \times \frac{\text{Channel } freq.}{2}.$$

In the equation, REF_CLK denotes a reference clock, REF_DIV (e.g., REF_DIV<12:0>) denotes a value used to set a length of a mask time, and Channel freq. denotes a target frequency. In an example, the frequency of the oscillator may be divided by "2", and accordingly, a channel frequency may also be divided by "2", and may be used as "Channel freq./2" as described above.

TABLE 1

| CH_SEL | Target Freq. (GHz) | REF_CLK (MHz) | REF_DIV <12:0> | REF_CNT <17:0> |
|---|---|---|---|---|
| 0 | 2.36 | 24 | 120 | 5900 |
| 1 | 2.365 | 24 | 120 | 5913 |
| 2 | 2.37 | 24 | 120 | 5925 |
| 3 | 2.375 | 24 | 120 | 5938 |
| 4 | 2.38 | 24 | 120 | 5950 |
| 5 | 2.385 | 24 | 120 | 5963 |
| 6 | 2.39 | 24 | 120 | 5975 |
| 7 | 2.395 | 24 | 120 | 5988 |
| 8 | 2.4 | 24 | 120 | 6000 |
| 9 | 2.405 | 24 | 120 | 6013 |
| 10 | 2.41 | 24 | 120 | 6025 |
| 11 | 2.415 | 24 | 120 | 6038 |
| 12 | 2.42 | 24 | 120 | 6050 |
| 13 | 2.425 | 24 | 120 | 6063 |
| 14 | 2.43 | 24 | 120 | 6075 |
| 15 | 2.435 | 24 | 120 | 6088 |
| 16 | 2.44 | 24 | 120 | 6100 |
| 17 | 2.445 | 24 | 120 | 6113 |
| 18 | 2.45 | 24 | 120 | 6125 |
| 19 | 2.455 | 24 | 120 | 6138 |
| 20 | 2.46 | 24 | 120 | 6150 |
| 21 | 2.465 | 24 | 120 | 6163 |
| 22 | 2.47 | 24 | 120 | 6175 |
| 23 | 2.475 | 24 | 120 | 6188 |
| 24 | 2.48 | 24 | 120 | 6200 |
| 25 | 2.485 | 24 | 120 | 6213 |
| 26 | 2.49 | 24 | 120 | 6225 |
| 27 | 2.495 | 24 | 120 | 6238 |
| 28 | 2.5 | 24 | 120 | 6250 |

TABLE 2

| CH_SEL | Target Freq. (GHz) | REF_CLK (MHz) | REF_DIV <12:0> | REF_CNT <17:0> |
|---|---|---|---|---|
| 0 | 2.36 | 24 | 1000 | 49167 |
| 1 | 2.365 | 24 | 1000 | 49271 |
| 2 | 2.37 | 24 | 1000 | 49375 |
| 3 | 2.375 | 24 | 1000 | 49479 |
| 4 | 2.38 | 24 | 1000 | 49583 |
| 5 | 2.385 | 24 | 1000 | 49688 |
| 6 | 2.39 | 24 | 1000 | 49792 |
| 7 | 2.395 | 24 | 1000 | 49896 |
| 8 | 2.4 | 24 | 1000 | 50000 |
| 9 | 2.405 | 24 | 1000 | 50104 |
| 10 | 2.41 | 24 | 1000 | 50208 |
| 11 | 2.415 | 24 | 1000 | 50313 |
| 12 | 2.42 | 24 | 1000 | 50417 |
| 13 | 2.425 | 24 | 1000 | 50521 |
| 14 | 2.43 | 24 | 1000 | 50625 |
| 15 | 2.435 | 24 | 1000 | 50729 |
| 16 | 2.44 | 24 | 1000 | 50833 |
| 17 | 2.445 | 24 | 1000 | 50938 |
| 18 | 2.45 | 24 | 1000 | 51042 |
| 19 | 2.455 | 24 | 1000 | 51146 |
| 20 | 2.46 | 24 | 1000 | 51250 |
| 21 | 2.465 | 24 | 1000 | 51354 |
| 22 | 2.47 | 24 | 1000 | 51458 |
| 23 | 2.475 | 24 | 1000 | 51563 |
| 24 | 2.48 | 24 | 1000 | 51667 |
| 25 | 2.485 | 24 | 1000 | 51771 |
| 26 | 2.49 | 24 | 1000 | 51875 |
| 27 | 2.495 | 24 | 1000 | 51979 |
| 28 | 2.5 | 24 | 1000 | 52083 |

In a simulation for a DPLL circuit designed according to various examples, a coarse capacitor and a fine capacitor of an oscillator may be adjusted sequentially from an MSB to an LSB every time the signal CNT_MASK is provided. For example, when an operation for each bit is completed in a capacitor bank of the oscillator, the DPLL may be reset by a signal CT_RST.

For example, when all capacitor values from an MSB to an LSB in a capacitor bank are found, a signal Coarse_Lock indicating completion of an operation may be generated. In an example of a capacitor bank of 15 bits, the frequency tuner may operate 15 times. In response to the signal Coarse_Lock being generated, units other than the frequency tuner may be turned off. Thus, power consumption may be minimized.

Figure 8:
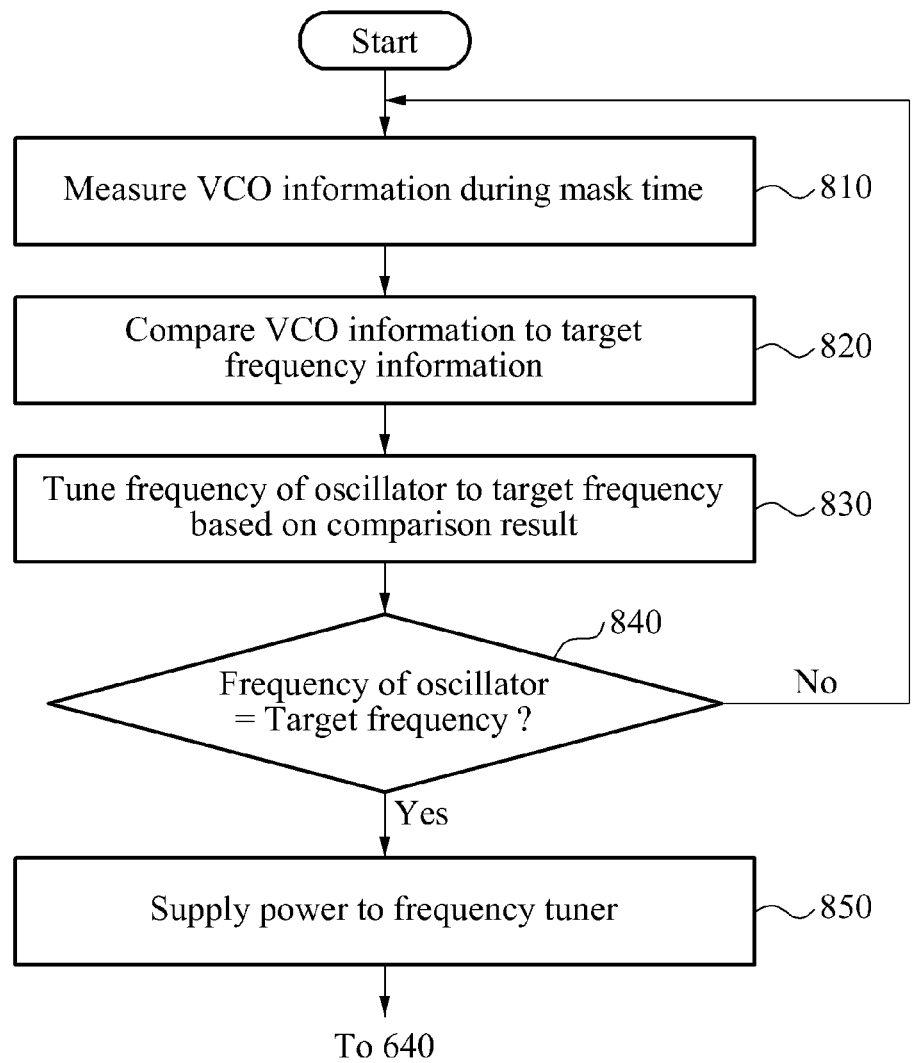
FIG. 8 is a flowchart illustrating an example of a method of controlling a DPLL.

FIG. 8 illustrates an example of a method of controlling a DPLL. In an example, a timing generator may divide a reference frequency, and may provide a timing signal used to allow the DPLL to operate. For example, the timing generator may generate an enable signal for each of a counter, a comparator, and a frequency tuner.

Additionally, a mapping table may be generated to store, in advance, target frequency information of each of frequencies corresponding to a mask time among frequencies in a predetermined range. The mapping table may be generated during processing of a transceiver, or may be generated by a transceiver during an initial operation of the transceiver. The predetermined range may be, for example, a range of frequencies at which a transceiver operates in a predetermined standard.

The target frequency information may include, for example, a number of times an oscillator oscillates (e.g., REF_CNT) during a mask time needed to coarsely tune a frequency of the oscillator (e.g., MASK_TIME_coarse) and corresponding to the target frequency, and/or a number of times an oscillator oscillates (e.g., REF_CNT) during a mask time needed to finely tune the frequency of the oscillator (e.g., MASK_TIME_fine) and corresponding to the target frequency. The mask times may be stored in the form of REF_DIV, as described in Tables 1 and 2.

In operation 810, the counter measures VCO information for an oscillator during a mask time. The VCO information may include, for example, a frequency of the oscillator, and/or the number of times the oscillator oscillates during the mask time. For example, the counter may count the number of times the oscillator oscillates.

In operation 820, the comparator compares target frequency information to the VCO information. The comparator may provide a frequency tuner with a comparison result obtained by comparing the target frequency information to the VCO information. For example, when the number of times the oscillator oscillates that is included in the VCO information is less than a number of times the oscillator oscillates that corresponds to the target frequency and that is included in the target frequency information, an output signal UP to increase the frequency of the oscillator may be provided to the frequency tuner. In this example, the number of times the oscillator oscillates that corresponds to the target frequency may be the number of times the oscillator oscillates at the target frequency during a mask time.

In operation 830, the frequency tuner tunes the frequency of the oscillator to the target frequency based on the comparison result. For example, the frequency tuner may tune the frequency of the oscillator to the target frequency based on a comparison result obtained by comparing the VCO information to target frequency information stored in advance in the mapping table. In this example, a first tuning controller may coarsely tune the frequency of the oscillator based on the comparison result. Additionally, a second tuning controller may finely tune the frequency of the oscillator based on the comparison result.

In operation 840, the DPLL determines whether the frequency of the oscillator matches the target frequency. For example, the DPLL determines whether the frequency of the oscillator that is determined by a capacitor bank matches the target frequency at a point in time at which the frequency tuner completes tuning of all capacitors in the capacitor bank. When the frequency of the oscillator is determined to match the target frequency, the method continues in operation 850. Otherwise, the method returns to operation 810. For example, when the capacitor bank includes 15 bits, the DPLL may repeatedly perform 15 times operations 810 through 830.

In operation 850, the DPLL supplies power to the frequency tuner. For example, the DPLL may supply power used to maintain the frequency of the oscillator matching the target frequency. The method may continue in operation 640 of FIG. 6.

In operation 640 of FIG. 6, the DPLL may allow the oscillator to oscillate at a frequency tuned during a data transmission and reception time.

The examples of a DPLL described may minimize power consumption and an area. Additionally, according to various examples, it is possible to increase a counting time and a frequency resolution by tuning a frequency of an oscillator based on VCO information obtained by counting output signals of the oscillator. Accordingly, a DPLL may have desired frequency accuracy in an Rx mode, and thus, may function as an accurate frequency synthesizer. Moreover, according to various examples, it is possible to perform fast locking by adjusting a mask time.

Furthermore, according to various examples, it is possible to easily modify a circuit based on a frequency resolution specification in various application fields. Additionally, a transceiver may have scalability by adding a function of adjusting a frequency resolution, for example, a function of adjusting a mask time. In addition, according to various examples, when a DPLL allows a frequency of an oscillator to match a target frequency, most units of the DPLL may be turned off. Thus, it is possible to minimize overall average power consumption.

Additionally, according to various examples, an average current as an index of average power consumption of a DPLL may be represented by $$\text{Average Current} = \frac{t_{PLL\ active} \times I_{PLL\ active} + t_{PLL\ inactive} \times I_{PLL\ inactive}}{t_{TRX\ transmission\ period}}.$$

The DPLL may set a frequency of an oscillator through PLL locking prior to a data transmission and reception time (for example, pre-calibration of a DPLL before Rx/Tx data transmission), and may be deactivated during the data transmission and reception time (Duty cycled PLL operation).

Furthermore, according to various examples, during deactivation of a DPLL, power consumption of the DPLL may be minimized. For example, during the deactivation of the DPLL, a frequency may be hold using a minimum number of units, for example, using a frequency tuner that is a register. Accordingly, frequency drift may be minimized during the deactivation of the DPLL.

Moreover, according to various examples, current may not leak in a control voltage node of an oscillator, and accordingly, frequency drift may be minimized without a separate leakage compensation circuit. In addition, according to various examples, a DPLL may be applied to a low power transceiver, an ULP transceiver, a super-regenerative receiver (SRR), a wake-up receiver with a connectivity solution, and/or a medical implant communication service (MICS). The wake-up receiver may include, for example, a wireless local area network (WLAN), a Bluetooth, and/or a Zigbee.

The various units, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A phase-locked loop (PLL), comprising:
    a counter configured to measure voltage-controlled oscillator (VCO) information of an oscillator during a mask time; and
    a frequency tuner configured to tune a frequency of the oscillator to a target frequency, based on a comparison result obtained by comparing the VCO information to target frequency information,
    wherein, in response to the frequency of the oscillator matching the target frequency, the PLL is configured to supply power to the frequency tuner to be used to maintain the frequency of the oscillator matching the target frequency.

2. The PLL of claim 1, further comprising:
    a comparator configured to compare the VCO information to the target frequency information, to obtain the comparison result.

3. The PLL of claim 1, further comprising:
    a timing generator configured to
        divide a reference frequency, and
        provide a timing signal to be used to operate the counter, the comparator, and the frequency tuner, based on the divided reference frequency.

4. The PLL of claim 1, further comprising:
    a mapping table configured to store, in advance, the target frequency information of each of frequencies that corresponds to the mask time, among frequencies in a predetermined range.

5. The PLL of claim 1, wherein the target frequency information comprises either one or both of a number of times the oscillator oscillates during a mask time needed to coarsely tune the frequency of the oscillator and corresponding to the target frequency, and a number of times the oscillator oscillates during a mask time needed to finely tune the frequency of the oscillator and corresponding to the target frequency.

6. The PLL of claim 1, wherein the frequency tuner comprises:
a first tuning controller configured to coarsely tune the frequency of the oscillator to the target frequency, based on the comparison result; and
a second tuning controller configured to finely tune the frequency of the oscillator to the target frequency, based on the comparison result.

7. The PLL of claim 1, wherein:
the VCO information comprises at least one of the frequency of the oscillator, or a number of times the oscillator oscillates during the mask time; and
the counter is configured to count the number of times the oscillator oscillates.

8. The PLL of claim 1, further comprising:
the oscillator configured to oscillate at the tuned frequency during a data transmission and reception time.

9. A method of controlling a phase-locked loop (PLL), the method comprising:
measuring voltage-controlled oscillator (VCO) information of an oscillator during a mask time;
tuning a frequency of the oscillator to a target frequency, based on a comparison result obtained by comparing the VCO information to target frequency information; and
in response to the frequency of the oscillator matching the target frequency, supplying power to be used maintain the to frequency of the oscillator matching the target frequency.

10. The method of claim 9, further comprising:
comparing the VCO information to the target frequency information, to obtain the comparison result.

11. The method of claim 9, further comprising:
dividing a reference frequency; and
providing a timing signal to be used to operate the PLL, based on the divided reference frequency.

12. The method of claim 9, further comprising:
storing, in advance, the target frequency information of each of frequencies that corresponds to the mask time, among frequencies in a predetermined range.

13. The method of claim 9, wherein the target frequency information comprises either one or both of a number of times the oscillator oscillates during a mask time needed to coarsely tune the frequency of the oscillator and corresponding to the target frequency, and a number of times the oscillator oscillates during a mask time needed to finely tune the frequency of the oscillator and corresponding to the target frequency.

14. The method of claim 9, wherein the tuning comprises:
coarsely tuning the frequency of the oscillator to the target frequency, based on the comparison result; and
finely tuning the frequency of the oscillator to the target frequency, based on the comparison result.

15. The method of claim 9, wherein:
the VCO information comprises at least one of the frequency of the oscillator, or a number of times the oscillator oscillates during the mask time; and
the measuring comprises counting the number of times the oscillator oscillates.

16. The method of claim 9, further comprising:
oscillating at the tuned frequency during a data transmission and reception time.

17. An ultra low power (ULP) transceiver with a phase-locked loop (PLL), the ULP transceiver comprising:
a reception (Rx) path configured to receive data in an Rx mode;
a transmission (Tx) path configured to transmit data in a Tx mode; and
the PLL configured to
measure voltage-controlled oscillator (VCO) information of an oscillator during a mask time of the Rx mode and the Tx mode, and
tune a frequency of the oscillator to a target frequency, based on a comparison result obtained by comparing the VCO information to target frequency information,
wherein, in response to the frequency of the oscillator matching the target frequency, the PLL is configured to supply power to be used to maintain the frequency of the oscillator matching the target frequency.

18. A phase-locked loop (PLL), comprising:
a counter configured to count a number of times an oscillator oscillates during a mask time;
a comparator configured to compare the number of times the oscillator oscillates to a target number of times the oscillator oscillates that corresponds to a target frequency; and
a frequency tuner configured to tune a frequency of the oscillator to the target frequency, based on the comparison,
wherein, in response to the frequency of the oscillator matching the target frequency, the PLL is configured to supply power to the frequency tuner to be used to maintain the frequency of the oscillator matching the target frequency.

19. The PLL of claim 18, wherein the target number of times the oscillator oscillates is during at least one of a coarse mask time needed to coarsely tune the frequency of the oscillator, or a fine mask time needed to finely tune the frequency of the oscillator.

20. The PLL of claim 18, wherein the frequency tuner comprises:
a first tuning controller configured to coarsely tune the frequency of the oscillator to the target frequency for a first period, based on the comparison; and
a second tuning controller configured to finely tune the frequency of the oscillator to the target frequency for a second period greater than the first period, based on the comparison.

* * * * *